(12) United States Patent
Pritiskutch

(10) Patent No.: US 8,803,599 B2
(45) Date of Patent: Aug. 12, 2014

(54) DENDRITE RESISTANT INPUT BIAS NETWORK FOR METAL OXIDE SEMICONDUCTOR FIELD EFFECT TRANSISTOR (MOSFET) DEVICES

(75) Inventor: John C. Pritiskutch, Orwigsburg, PA (US)

(73) Assignee: STMicroelectronics, Inc., Coppell, TX (US)

( * ) Notice: Subject to any disclaimer, the term of this patent is extended or adjusted under 35 U.S.C. 154(b) by 154 days.

(21) Appl. No.: 12/925,224

(22) Filed: Oct. 15, 2010

(65) Prior Publication Data

US 2011/0291752 A1 Dec. 1, 2011

Related U.S. Application Data

(60) Provisional application No. 61/396,365, filed on May 26, 2010.

(51) Int. Cl.
*H03K 5/08* (2006.01)

(52) U.S. Cl.
USPC .......................................................... 327/581

(58) Field of Classification Search
USPC ............................... 327/581; 29/825; 257/461
See application file for complete search history.

(56) References Cited

U.S. PATENT DOCUMENTS

| | | | | |
|---|---|---|---|---|
| 5,010,305 A | * | 4/1991 | Shiga | 330/277 |
| 5,757,229 A | * | 5/1998 | Mitzlaff | 330/124 R |
| 2004/0000952 A1 | * | 1/2004 | Lautzenhiser et al. | 330/295 |
| 2006/0044180 A1 | * | 3/2006 | Ikeda et al. | 342/91 |
| 2011/0254117 A1 | * | 10/2011 | Kozicki | 257/461 |

* cited by examiner

*Primary Examiner* — Vongsavanh Sengdara

(57) ABSTRACT

A circuit includes a direct current (DC) gate termination impedance having an impedance for DC signals higher than a maximum impedance DC at which dendrite growth occurs in the circuit, and a radio frequency (RF) gate termination impedance having an impedance for RF signals lower than a maximum impedance at which RF stability for the circuit is maintained for an application.

21 Claims, 2 Drawing Sheets

US 8,803,599 B2

DENDRITE RESISTANT INPUT BIAS NETWORK FOR METAL OXIDE SEMICONDUCTOR FIELD EFFECT TRANSISTOR (MOSFET) DEVICES

CROSS-REFERENCE TO RELATED APPLICATION(S) AND CLAIM OF PRIORITY

The present application claims priority to U.S. Provisional Patent Application Ser. No. 61/396,365, filed May 26, 2010, entitled "DENDRITE RESISTANT INPUT BIAS NETWORK FOR MOSFET DEVICES". The content of the above-identified patent document(s) is incorporated herein by reference.

TECHNICAL FIELD

The present application relates generally to the deposition of ions at localized sites of metal oxide semiconductor field effect transistor (MOSFET) devices and, more specifically, to a system and method for eliminating dendrite growth resulting from the repeated deposition of ions.

BACKGROUND

Silver electromigration (i.e., Ag dendrite) is primarily a direct current phenomenon. Dendrite growth appears as a fern like growth along a surface. Silver dendrite growth requires available silver (exposed silver), a migration medium (moisture), an electric field (gate-source voltage), and a surface (such as beryllium oxide (BeO)).

Silver can electromigrate under non-condensing but humid conditions (i.e., humid electromigration). The rate of electromigration increases directly with relative humidity. In some cases, the moisture needed for electromigration is just a few monolayers of moisture. The positively charged ions of the silver metal move under the influence of an electric field through the moisture paths on the insulator toward the negative conductor where the ions are reduced back to silver metal.

SUMMARY

A circuit includes a direct current (DC) impedance connecting a transistor gate to ground and having an impedance for DC signals that is higher than a maximum impedance DC at which dendrite growth occurs in the circuit, and a radio frequency (RF) impedance connecting the gate to ground and having an impedance for RF signals that is lower than a maximum impedance at which RF stability for the circuit is maintained.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

A MOSFET is a high impedance input device. In order for the MOSFET to remain in the active region, a voltage needs to be applied to invert the channel. The voltage that is required to invert the channel typically ranges from 3 to 6 volts of a direct current (DC) voltage. However, the transistors leads for the packages used to carry the MOSFETS are typically braised to the package with a material that contains silver. The package is then plated with gold to protect the silver from outside environmental influences. When a voltage is applied between the gate terminal and the source terminal of the package for the MOSFET to remain in the active region, the electric field that is between the two terminals can allow the silver to migrate in the presence of humidity if the silver is not plated properly by the gold.

Figure 1:
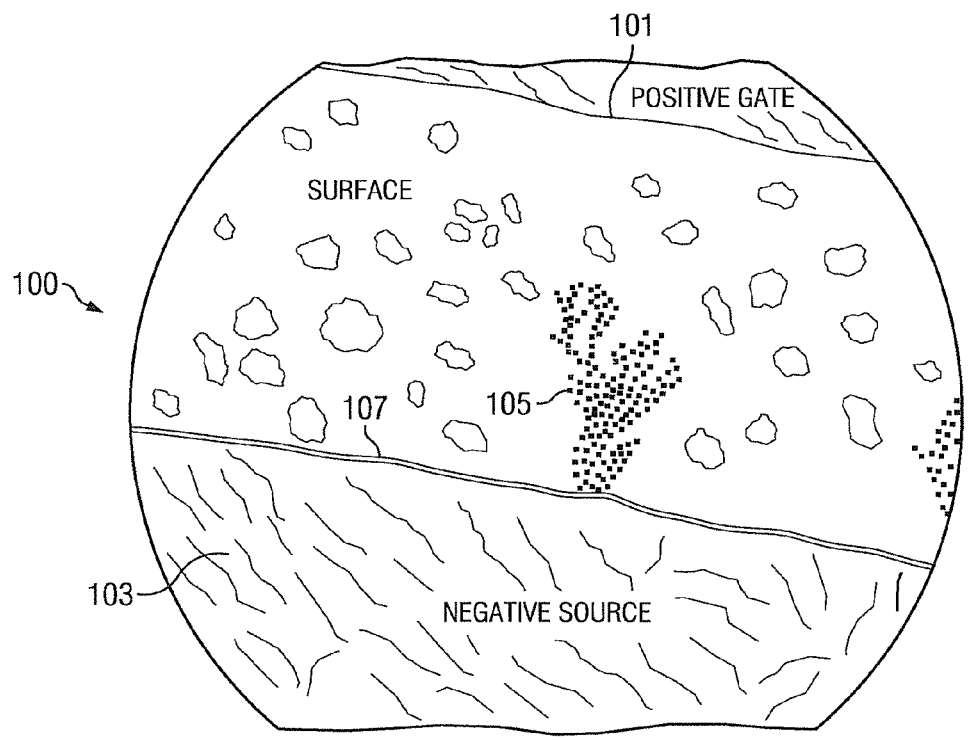
FIG. 1 illustrates silver dendrite growth in a MOSFET.

FIG. 1 illustrates silver dendrite growth 105 in a MOSFET 100.

In the example shown in FIG. 1, silver ions migrate from a positive gate 101 to a negative source 103 of a MOSFET 100. The ions build upon themselves and eventually create a fern-like structure of dendrite growth 105 along an insulator surface 107 of the negative source 103. The dendrite growth 105 continues to grow from the negative source 103 towards the direction of the positive gate 101, and eventually creates a short or a low impedance path between the positive gate 101 and the negative source 103. Because a MOSFET ideally has infinite input impedance, any leakage or conductive path, such as that created by the dendrite growth 105, causes the MOSFET to de-bias itself. This de-biasing may cause the MOSFET to no longer meet the requirements for a particular system.

This disclosure provides a system and method for eliminating dendrite growth in MOSFET devices.

A low impedance gate to source resistance is normally desired for a gate biasing circuit because MOSFETS typically exhibit a certain amount of instabilities at various frequencies in the RF spectrum. The MOSFET is made stable by picking a certain gate to source resistance. However, having a gate to source resistance that allows a MOSFET to be stable also creates a low impedance DC and radio frequency (RF) gate termination. While a low impedance DC and radio frequency (RF) gate termination creates an electric field with enough energy to support dendrite growth. Therefore, while this gate to source resistance may be advantageous stability, such a resistance is also conducive to dendrite growth.

In an embodiment of this disclosure, external circuit techniques are used to eliminate dendrite growth in MOSFET devices. The probability of repeated deposition at localized sites is reduced by current density reduction within an applied electric field. Current density reduction electroplates the negative terminal "uniformly" with silver, eliminating any dendrite growth across the insulator surface.

Figure 2:
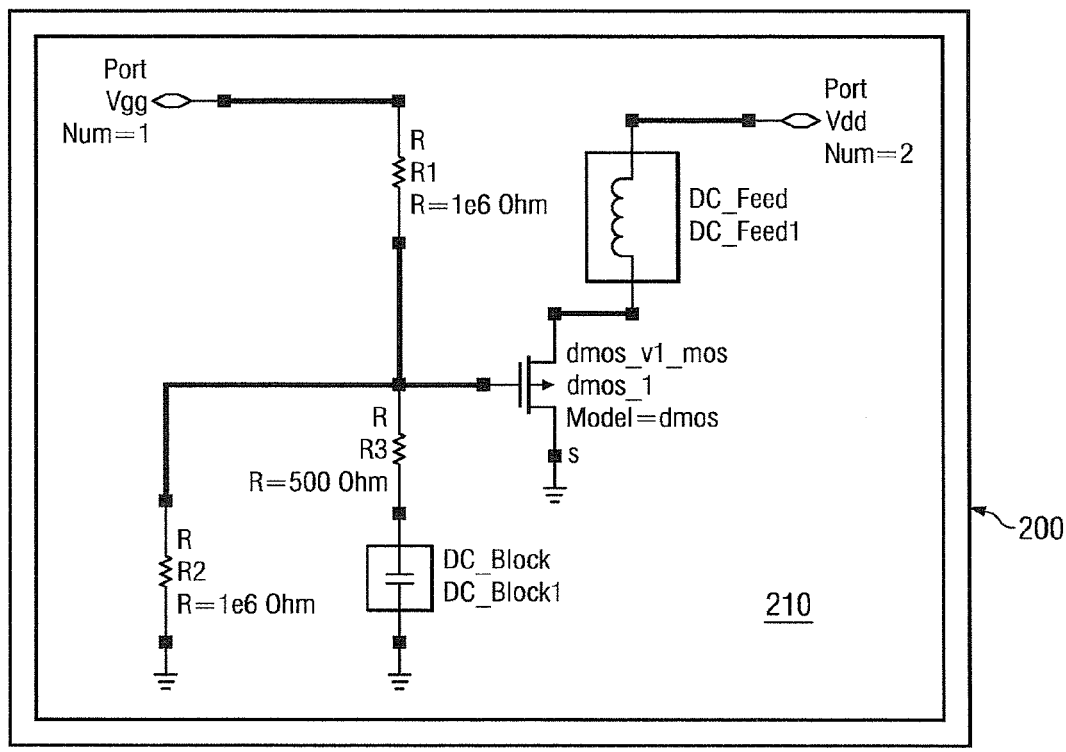
FIG. 2 illustrates a device having a transistor gate biasing circuit that provides a high impedance DC gate termination and a low impedance RF gate termination according to an embodiment of this disclosure.

FIG. 2 illustrates a device 200 having a transistor gate biasing circuit 210 that provides a high impedance DC gate termination and a low impedance RF gate termination according to an embodiment of this disclosure.

Because the gate impedance of a MOSFET is infinite, a steady or very low impedance DC power supply to bias the MOSFET is not needed. Accordingly, in the example shown in FIG. 2, circuit 210 is biased with an infinite impedance, such as the 1 mega-ohm voltage divider formed by 1 mega-ohm resistors R1 and R2, instead of a low impedance DC power supply. This reduces the amount of energy available for dendrite growth. Furthermore, a lower resistance path to ground formed by a typical gate to source resistance, such as that formed by the 500 ohm resistor R3, is bypassed. Therefore, from a DC perspective, the circuit 210 exhibits a mega-ohm to ground resistance. However, from an RF perspective, the circuit 210 exhibits a parallel resistance formed by the combination of the 1 mega-ohm resistor R2 and the 500 ohm resistor R3, which is effectively 500 ohms. The DC block DC_Block ensures that the circuit path from resistor R3 to ground is shorted for RF signals and infinite (open) for DC signals.

The gate termination impedance DC of the circuit 210 for DC signals is high in the sense that the impedance is higher than a maximum impedance to the DC signals for the circuit 210 at which dendrite growth occurs. The gate termination impedance RF for RF signals is low in the sense that the impedance RF is lower than a maximum impedance at which RF stability for the circuit 210 is maintained for a particular application.

Accordingly, the gate biasing circuit 210 as shown in FIG. 2 eliminates silver dendrite growth while maintaining acceptable RF stability.

Of course one of ordinary skill in the art would recognize that circuit 210 is only one example of a gate biasing circuit according to this disclosure and that other circuit designs are within the scope of this disclosure.

Figure 3:
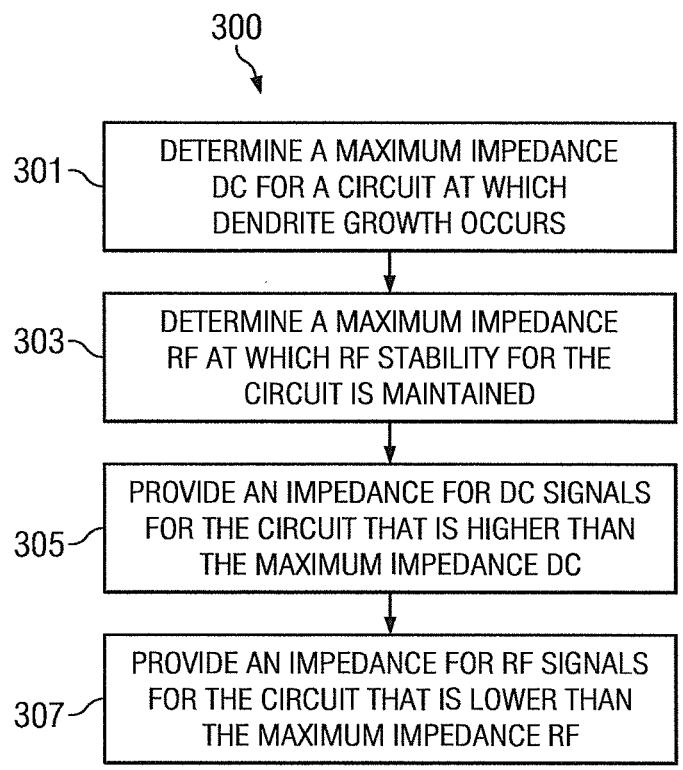
FIG. 3 illustrates a method for manufacturing a gate biasing circuit according to an embodiment of this disclosure.

FIG. 3 illustrates a method 300 for manufacturing a gate biasing circuit according to an embodiment of this disclosure.

As shown in FIG. 3, method 300 includes determining a maximum impedance to DC signals for a circuit at which dendrite growth occurs (block 301). Method 300 also includes determining a maximum impedance to RF signals at which RF stability for the circuit is maintained for a particular application (block 303). Method 300 further includes providing an impedance for DC signals between the gate transistor and ground that is higher than the above-described maximum impedance for DC signals (block 305), and providing an impedance for RF signals between the gate transistor and ground that is lower than the above-described maximum impedance for RF signals (block 307).

Figure 4:
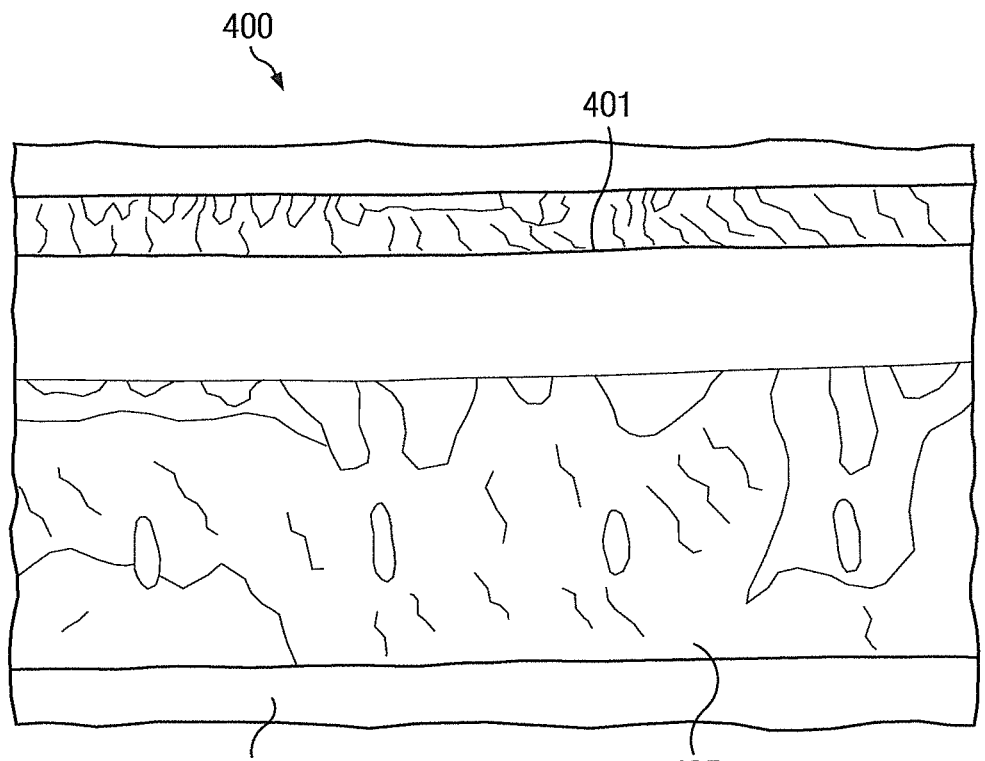
FIG. 4 shows a negative potential terminal (or source strip) plated "uniformly" with silver due to low current density according to an embodiment of this disclosure.

FIG. 4 illustrates a MOSFET 400 having a negative source plated "uniformly" with silver according to an embodiment of this disclosure.

As shown in FIG. 4, silver ions migrate from a positive gate 401 to a negative source 403 of MOSFET 400. However, unlike MOSFET 100, the ions in MOSFET 400 form a uniform layer 405 along an insulator surface of the negative source 403. As a result, the negative potential terminal in FIG. 4 has a reduced probability for dendrite deposition. Once the entire exposed available silver is depleted, no possibility of silver dendrite growth exists, regardless of the gate bias supply impedance.

Accordingly, moving any exposed available Ag material from within the leadframe and attaching the material with low current density prevents localized repeated Ag deposition (Ag dendrites) from causing device failure.

Although the present disclosure has been described with an exemplary embodiment, various changes and modifications may be suggested to one skilled in the art. It is intended that the present disclosure encompass such changes and modifications as fall within the scope of the appended claims.

The invention claimed is:

1. A circuit, comprising:
a transistor comprising a gate;
a gate termination subcircuit connecting the gate to ground, the gate termination subcircuit comprising a direct current (DC) block,
the DC block configured to cause the gate termination subcircuit to exhibit:
a DC impedance to DC signals applied to the gate, and
a radio frequency (RF) impedance to RF signals applied to the gate,
wherein the DC impedance is higher than a maximum gate termination DC impedance at which dendrite growth occurs on the gate, and
wherein the RF impedance is lower than a maximum gate termination RF impedance at which RF stability for the circuit is maintained.

2. The circuit in accordance with claim 1, wherein the gate is biased with an infinite impedance for DC signals.

3. The circuit in accordance with claim 2, wherein the infinite impedance is created by an open circuit of the DC block.

4. The circuit in accordance with claim 1, wherein the subcircuit includes:
a first path between the gate and the ground, and
a second path between the gate and the ground,
the first path configured to provide the DC impedance, and
the first and second paths together configured to provide the RF impedance.

5. The circuit in accordance with claim 4, wherein the first path exhibits a mega-ohm resistance to the DC signals, and the first and second paths together exhibit a resistance to the RF signals that is lower than the mega-ohm resistance.

6. The circuit in accordance with claim 4, wherein the second path includes a 500 ohm resistor.

7. The circuit in accordance with claim 1, wherein:
the DC block is further configured to provide a short circuit for the RF signals and an infinite resistance for the DC signals.

8. A device, comprising:
a circuit including a transistor comprising a gate, the circuit further comprising:

a gate termination subcircuit connecting the gate to a ground, the gate termination subcircuit comprising a direct current (DC) block, the DC block configured to cause the gate termination subcircuit to exhibit:
 a DC impedance to DC signals applied to the gate, and
 a radio frequency (RF) impedance to RF signals applied to the gate,
wherein the DC impedance is higher than a maximum gate termination DC impedance at which dendrite growth occurs on the gate, and
wherein the RF impedance is lower than a maximum gate termination RF impedance at which RF stability for the circuit is maintained.

9. The device in accordance with claim 8, wherein the gate is biased with an infinite impedance for the DC signals.

10. The device in accordance with claim 9, wherein the infinite impedance is created by an open circuit of the DC block.

11. The device in accordance with claim 8, wherein the subcircuit includes:
 a first path between the gate and the ground, and
 a second path between the gate and the ground,
 the first path configured to provide the DC impedance and the first and second paths together providing the RF impedance.

12. The device in accordance with claim 11, wherein the first path exhibits a mega-ohm resistance to the DC signals and the first and second paths together exhibit a resistance to the RF signals that is lower than the mega-ohm resistance.

13. The device in accordance with claim 11, wherein the second path includes a 500 ohm resistor.

14. The device in accordance with claim 8, wherein:
 the DC block is configured to provide a short circuit for the RF signals and an infinite resistance for the DC signals.

15. A method for manufacturing a circuit including a transistor comprising a gate, the method comprising:
connecting the gate to a ground with a gate termination subcircuit, the gate termination subcircuit comprising a direct current (DC) block, the DC block exhibiting a DC impedance to DC signals applied to the gate and a radio frequency (RF) impedance to RF signals applied to the gate,
wherein the DC impedance is greater than a maximum gate termination DC impedance for the circuit at which dendrite growth occurs on the gate, and
wherein the RF impedance is lower than a maximum gate termination RF impedance at which RF stability for the circuit is maintained.

16. The method in accordance with claim 15, wherein the gate is biased with an infinite impedance for the DC signals.

17. The method in accordance with claim 16, wherein the infinite impedance is created by an open circuit of the DC block.

18. The method in accordance with claim 15, wherein the circuit includes:
 a first path between the gate and the ground, and
 a second path between the gate and the ground,
 wherein the first path is configured to provide the DC impedance, and
 wherein the first and second paths together are configured to provide the RF impedance.

19. The method in accordance with claim 18, wherein the first path exhibits a mega-ohm resistance to the DC signals and wherein the first and second paths together exhibit a resistance to the RF signals that is lower than the mega-ohm resistance.

20. The method in accordance with claim 18, wherein the second path includes a 500 ohm resistor.

21. The method in accordance with claim 15, wherein the DC block is configured to provide a short circuit for the RF signals and an infinite resistance for the DC signals.

* * * * *

UNITED STATES PATENT AND TRADEMARK OFFICE
CERTIFICATE OF CORRECTION

| | | |
|---|---|---|
| PATENT NO. | : 8,803,599 B2 | Page 1 of 1 |
| APPLICATION NO. | : 12/925224 | |
| DATED | : August 12, 2014 | |
| INVENTOR(S) | : Pritiskutch | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 142 days.

Signed and Sealed this
Twelfth Day of April, 2016

Michelle K. Lee
*Director of the United States Patent and Trademark Office*